United States Patent [19]

Levy et al.

[11] 3,776,729

[45] Dec. 4, 1973

[54] PHOTOSENSITIVE DIELECTRIC COMPOSITION AND PROCESS OF USING THE SAME

[75] Inventors: M. Frank Levy, Los Gatos, Calif.; George P. Schmitt, Vestal, N.Y.

[73] Assignee: International Business Machines Corporation, Armonk, N.Y.

[22] Filed: Feb. 22, 1971

[21] Appl. No.: 117,808

[52] U.S. Cl. .................... 96/35.1, 96/38.2, 96/38.4, 96/115 R, 96/115 P, 204/159.15

[51] Int. Cl. .............................................. G03c 1/68

[58] Field of Search ............ 96/35.1, 115 R, 115 P; 204/159.15

[56] References Cited

UNITED STATES PATENTS

| | | | |
|---|---|---|---|
| 3,376,139 | 4/1968 | Giangualano et al. | 96/35.1 |
| 3,295,974 | 1/1967 | Erdmann | 96/115 R |
| 3,261,686 | 7/1966 | Celeste et al. | 96/115 P |
| 3,368,900 | 2/1968 | Burg | 96/115 P |
| 3,450,613 | 6/1969 | Steinberg | 204/159.15 |

FOREIGN PATENTS OR APPLICATIONS

| | | | |
|---|---|---|---|
| 246,320 | 6/1969 | U.S.S.R. | 96/115 P |

*Primary Examiner*—Ronald H. Smith
*Attorney*—Sughrue, Rothwell, Mion, Zinn & Macpeak

[57] ABSTRACT

A photosensitive dielectric composition comprising a first polymer system formed by the photopolymerization of a multi-functional vinyl monomer, e.g., pentaerythritol tetraacrylate, in the presence of a partially cured second polymer system. The first polymer system occludes therein the second polymer system which has been finally cured, i.e., cross-linked by an ionic mechanism, subsequent to the polymerization of the first polymer system, e.g., the second polymer system can be an epoxy resin. One process for forming the above composition comprises applying a solution of pentaerythritol tetraacrylate monomer, a photosensitizer, the epoxy resin cured to the B-stage and a curing agent for the epoxy resin onto a support, selectively exposing the same to radiation to polymerize the tetraacrylate monomer, washing the same in an appropriate solvent to remove the components in areas unexposed to light and baking the assembly to cross-link the epoxy resin which is occluded within the tetraacrylate polymer.

15 Claims, No Drawings

PHOTOSENSITIVE DIELECTRIC COMPOSITION AND PROCESS OF USING THE SAME

BACKGROUND OF THE INVENTION

1. Field of the Invention

The present invention relates to photosensitive dielectric compositions and processes for using and forming the same.

2. Description of the Prior Art

U. S. Pat. No. 3,261,686 discloses photopolymerizable compositions comprising a thermoplastic macromolecular organic polymer solid at 50° C and at least one ester of a pentaerythritol containing one to two pentaerythritol nucleii wherein the three bonds thereon are substituted with certain radicals, e.g., dipentaerythritol tetraacrylate. The composition may also contain an organic plasticizer for the thermoplastic polymer, an addition polymerization initiator activatable by actinic radiation, etc.

U. S. Pat. No. 3,368,900 discloses a photopolymerizable composition comprising at least one addition polymerizable ethylenically unsaturated compound capable of forming a high polymer by photopolymerization in the presence of an addition polyermization initiator, a polynuclear quinone of a certain structure and an aromatic aldehyde as an accelerator for the photopolymerization. Other additives, e.g., compatible binder materials, may be present.

U. S. Pat. No. 3,376,139 discloses a photosensitive prepolymer composition comprising a prepolymer of an aryl allyl ester having two or more allyl groups in combination with an initiator or sensitizing agent in a solvent. The sensitizing agent absorbs actinic radiation to provide free radicals which accelerate complete polymerization of the prepolymer.

U. S. Pat. No. 3,450,613 discloses a photopolymerizable epoxy resin comprising a reaction product of an epoxy resin prepolymer and an alpha-beta ethylenically unsaturated organic acid. An amount of photosensitizing agent sufficient to actuate the double bond in the described epoxy ester upon exposure to light is also present.

SUMMARY OF THE INVENTION

The present invention provides a photosensitive dielectric material which can be processed utilizing the basic techniques known as photoresist techniques.

The photosensitive dielectric composition of this invention comprises a first polymer system formed from multifunctional vinyl monomers which are photopolymerized via light-generated free radicals in the presence of a second polymer system, the second polymer system at the initiation of the polymerization of the first polymer system being at a stage of curing less than the final desired stage of curing of the second polymer system. Upon photopolymerizing the monomer(s) of the first polymer system a polymeric matrix is formed which occludes, or entangles, therein the second polymer system. The second polymer system is thereafter cured or cross-linked by an ionic mechanism, e.g., using a curing agent, whereupon the polymeric matrix of the photopolymerized monomers and the cross-linked structure of the second polymer system yield what is believed to be a complex physical entanglement of the two polymer systems.

The first polymer system, which is polyermized via light-generated free radicals, must be substantially completely insensitive to the curing agent for the second polymer system. The second polymer system need not be cured to completion by the light-generated free radicals produced during photopolymerization.

A process for using the photosensitive dielectric composition of the present invention comprises coating, on a substrate, a solution containing the multi-functional vinyl monomers, e.g., pentaerythritol tetraacrylate, the partially cured second polymer system, e.g., a B-staged epoxy resin, a curing agent for the epoxy resin and a photosensitizer to provide the light-generated free radicals, all in an appropriate solvent. The solvent is driven off and the resulting solid solution is then selectively exposed to actinic radiation to thereby polymerize the multi-function vinyl monomer in those areas exposed to light due to the decomposition of the photosensitizer. The assembly is then washed, thereby removing the multi-functional vinyl monomer/epoxy polymer etc. in those areas where exposure did not occur, and thereafter the assembly is cured, e.g., by baking, to advance the epoxy resin to the C-stage of curing, that is, to cross-link the epoxy resin.

The composition formed has very good electrical properties and can serve as the dielectric separating circuit layers in an interconnected multilayer circuit.

It is thus one object of the present invention to provide a novel photosensitive dielectric composition.

It is a further object of the present invention to provide a novel method for forming such a photosensitive dielectric composition and for using such a photosensitive dielectric composition.

DETAILED DESCRIPTION OF THE PREFERRED EMBODIMENT

The first polymer system of the present invention is based upon multi-functional vinyl monomers which are polymerized via light-generated free radicals, that is, which can be photopolymerized. In the context of the present invention, the term "multi-functional vinyl monomer" defines a molecule which contains more than one vinyl group. The vinyl group must be polymerizable by free radicals formed by the action of light on the initiator and must not spontaneously polymerize when in the photosensitive dielectric system, i.e., when in the presence of the second polymer system.

The most preferred multi-functional vinyl monomer used in the present invention is pentaerythritol tetraacrylate (hereinafter PETA). Another multi-functional vinyl monomer used in the present invention is dipentaerythritol fully substituted with acrylate groups. It is preferable that the monomer used be fully substituted with acrylate groups and that the acrylate group be unencumbered by substituents such as the methyl group in the methacrylate radical. The formula:

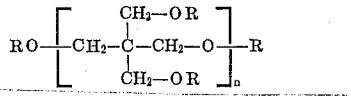

represents the preferred multi-functional vinyl monomers of this invention where n is 1 or 2 and R is

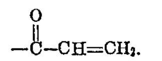

Mixtures of either of the above monomers can also be used in any proportion. However, it shall be understood that it is not necessary to use the above monomers in pure form. On the contrary, up to 40 percent of the monomer molecules (numerical basis) can have one R group which is not an acrylic group, i.e., up to 10 percent of the total R groups on the monomers need not be an acrylic group (but no two R groups on any molecule can be other than acrylic groups). The only restrictions on this R group which need not be an acrylic group is that it cannot interfere or prevent the polymerization of the monomer and it cannot be a group which might degrade during polymerization. For instance, representative of the R groups which can substitute for one acrylic group on a monomer molecule include a methacrylate group, a fatty acid group (preferably with no more than 18 carbon atoms), an aliphatic carboxylic acid group (preferably with no more than 18 carbon atoms), a hydroxyl group etc. Of course, should one desire such, the R groups which are other than acrylic groups need not be identical in one system, i.e., some could be methacrylate, others acids, etc.

However, systems of pure tetrafunctional monomer(s) are preferred, as some loss of resolution and speed are encountered where the substitution is not fully acrylic, e.g., with one hydroxyl substitution.

As indicated above, the multi-functional vinyl monomers used in the present invention (hereinafter MFVM) must be photopolymerizable, that is, the MFVM must be curable via light-generated free radicals which are produced during exposure to actinic radiation. In this regard, the MFVM must not be polymerized by the mere presence of the curing agent for the polymer system which is cured by an ionic mechanism. The photosensitizers for the MFVM system may be a substituted or unsubstituted quinone with aromatic rings fused to the carbonyl containing ring (i.e., the quinoid ring). The carbonyl group must be attached to one or more carbon atoms which are a part of the conjugated central ring. Examples of these compounds are: anthraquinone, butyl anthraquinone, phenanthroquinone, and xanthone. In addition ketaldonyl compounds such as benzyl may be used as photosensitizers. The absorption band of the photosensitizer (often merely referred to as a sensitizer) should be at a wavelength longer than the UV absorption of the other components. In addition the sensitizer must be soluble in the resin system and must not be thermally initiated at the temperature used to dry off solvents. Preferably the sensitizers form free radicals when inundated with light in the range 3,000 to 4,000 angstroms.

Broadly speaking, in the present invention, from about 3 to about 6 weight percent of the selected photosensitizing agent, based on the total weight of the resin and MFVM solids, should be present in the photosensitve dielectric composition.

The second polymer system of the present invention is based upon a polymer which can be curved by an ionic mechanism, that is, a polymer which is curved by means of a curing agent viz; dicyandiamide or organic acid anhydrides, both preferably with a tertiary amine accelerator for commercially rapid curing. The second polymer system must contain a polymer which can illustrate at least two degrees of curing, that is, an intermediate degree of curing and a final degree of curing. This restriction is imposed upon the second polymer system because of the fact that this polymer must be present at an intermediate degree of cure at the initiation of the polymerization of the MFVM and must thereafter be cured to its final, cross-linked stage. The second polymer is one which is not substantially cured or further polymerized by the action of the light-generated free radicals produced to polymerize the MFVM. The final cure of the second polymer will be achieved thermally.

The most preferred second polymers for use in the present invention are the epoxy resins which can be finally cured to produce a solid, thermoset, insoluble plastic. As curing of an epoxy resin basically involves the oxirane group, a great number of epoxy resin prepolymers are operable in the present invention, generally those based on polymerized bisphenol-A and those of the epoxy novalac type. For instance, suitable epoxy resins of the bisphenol-A type for use in the photosensitive dielectric composition of the present invention include the diglycidyl ethers of 4,4'-dihydroxydiphenylpropane (bis-phenol-A) having the general formula:

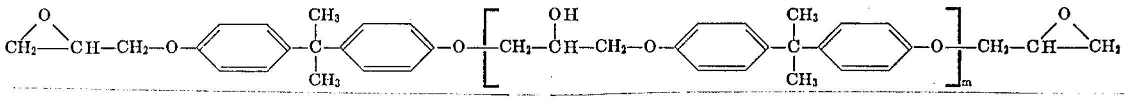

wherein m is 0, 1, 2 and up to about 20.

Most preferably, the epoxy resin is used in the form of a B-staged epoxy resin. The B-staged epoxy system must not harden appreciably at room temperature and must be soluble in a suitable solvent to allow liquification and mixing with the MFVM.

Most preferably the B-stage epoxy resin will have a molecular weight of from about 1,000 to about 4,000. Molecular weights much below about 1,000 tend to provide an initial film after solvent drive-off which is tacky and somewhat difficult to easily process. On the other hand, molecular weights much above 4,000 tend to provide an exposed film wherein the solubility difference between exposed and unexposed areas is not very great, and this tends to make it difficult to accurately remove insolubilized exposed material.

Suitable epoxy-novolac resins for use in the present invention include those of the formula:

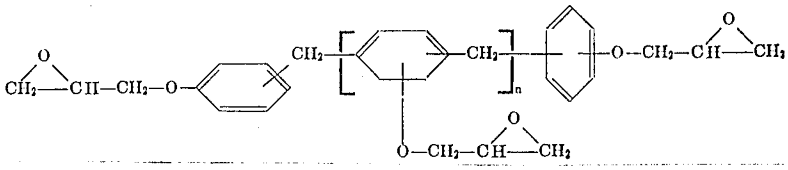

where n preferably varies from about 2/10 to about 2, as these resins are available as mixtures.

Generally speaking, in the present invention, the epoxy resin (this term includes both the bisphenol-A and epoxy-novolac types) in the B-stage will be a solid at room temperature which is soluble in non-destructive solvents. Needless to say, the molecular weight of the B-stage epoxy resin can vary so long as it is still possible to conduct further curing of the epoxy resin, i.e., the epoxy resin is not yet cross-linked.

When the epoxy resin is converted to the C-stage, it will be a solid, insoluble, infusable, totally cured material which essentially has a molecular weight of infinity.

The second polymer system can further contain up to 95 percent by weight of the second polymer of a phenoxy resin (i.e, 95 percent by weight of the second polymer system could be a phenoxy resin) and the objects of the present invention can still be obtained. While 50 percent phenoxy is preferred, amounts up to 95 percent can be used so long as the thermosetting character of the second polymer system is maintained. Most preferred are those phenoxy resins of the formula:

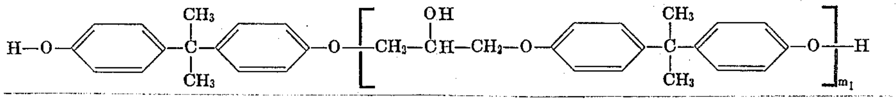

wherein $m_1$ is preferably selected so as to provide a weight average molecular weight of from about 80,000 to about 200,000. Lower weight average molecular weights can be used, but as one exceeds much over about 200,000 it is difficult to solubilize the phenoxy resin in the solvents used in the present invention. If desired, mixtures of bisphenol-A, epoxy-novolac and phenoxy resins can be used in any proportion, so long as the amount of phenoxy resin is not greater than 95 percent by weight of the second polymer system, i.e., the bisphenol-A resin, epoxy-novolac resin or mixtures thereof.

To cure the epoxy resins used in accordance with the present invention, one can use anhydride curing agents or dicyandiamide. Suitable anhydride curing agents are, i.e., maleic anhydride and chlorendic anhydride.

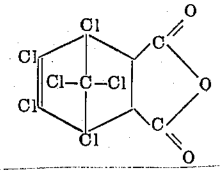

Generally speaking, any prior art epoxy curing agent can be used so long as:

1. it does not absorb light so strongly that it prevents the photopolymerization from proceeding at an acceptable rate; or
2. it does not enter into the energy transfer chain from the photosensitizer to the MFVM and thereby prevent photopolymerization; or
3. it does not enter into the polymerization reaction of the MFVM and thereby retard polymerization. Amine curing agents such as, e.g., methylene dianiline, meta phenylene diamine, aliphatic polyamines, ethylene diamine and triethylene tetraamine are unacceptable curing agents as they interfere with MFVM polymerization as described above.

Those anhydride curing agents discussed in Chapter 5, page 117ff, Lee and Neville, *Epoxy Resins, Their Application and Technology*, 1957, McGraw-Hill, are operable in the present invention.

As a general rule, from about 0.75 to about 1.25 molar equivalents of the selected curing agent are utilized in the composition for every molar equivalent of the oxirane groups present in the epoxy resin to be cured.

The curing agent used in the present invention is generally one which does not effect any substantial curing of the second polymer prior to the final baking or curing step as it is necessary that the second polymer be capable of further polymerization at the initiation of the photopolymerization of the MFVM system. The curing agent must further be one which does not effect the MFVM during radiation, as such feasibly might lead to undesired MFVM polymerization.

Generally speaking, it is preferred to use approximately equal weight amounts of the MFVM and the second polymer in the photosensitive dielectric composition of the present invention. However, a photosensitive dielectric composition in accordance with the present invention is obtained utilizing from 45 to 55 percent by weight of the first polymer system and from 55 to 45 percent by weight of the second polymer system, *(*this weight including the phenoxy resin, if present.) based on total polymeric constituents in the composition. (The amount of MFVM and epoxy resin initially present would be present at the same ratio). The following factors should be considered in "balancing" the amounts of the first polymer and second polymer in accordance with the present invention: Increasing the proportion of the second polymer improves stability of the system with respect to solvent resistance and thermal degradation. Increasing the proportion of the first polymer improves resolution.

Having thus described the polymeric constituents, photosensitizing agents and curing agents as may be used in the present invention, it is appropriate to turn to some of the processing aspects per se of the present invention and their influence upon the polymeric constituents.

The present invention from a processing aspect is basically premised upon the use of two independent chemical reactions, a photopolymerization process and an ionic curing process. One is thus able to obtain properties in the photosensitive dielectric composition which would be unobtainable with single-polymer systems, for instance the solvent resistance of an epoxy resin, when the system is fully cured, can be combined with the photosensitive characteristics of the acrylic monomer which allows the system to be selectively developed but which is poor in resistance to solvents.

For purposes of the following discussion, the MFVM will be pentaerythritol tetraacrylate (PETA) and, the second polymer an epoxy resin.

The first general step of the present invention is to bring together the PETA and the epoxy resin. Generally, this is done by taking a B-stage cured epoxy resin and dissolving this with the PETA and the photosensitizing agent in an appropriate inert solvent. By inert solvent is meant one which, although it dissolves both PETA and the second polymer, will not cause either to react. Representative examples of suitable inert solvents, are 1,1,1-trichloroethane and methyl ethyl ketone. The amount of inert solvent used is merely that amount required to dissolve all other components. Although no harm would be encountered by using greater amounts of solvent, this will generally not be done as it makes solvent drive-off a more time consuming process, and will also lead to more dilute solutions, which will generally be more difficult to handle. Since it is preferred to form a layer as close to a solid film as possible, one thus generally uses the minimum amount of solvent.

This solution is then coated on to the contemplated substrate and the solvent is driven off. As an alternative, the PETA and an A-stage epoxy resin can be combined with the photosensitizing agent and curing agent, and the solvent driven off and the cure of the A-stage advanced to the B-stage, either in separate steps or simultaneously. Neither are decomposed or activated at the temperatures of solvent drive off (or A-stage advancement, if an A-stage epoxy is used). An A-stage epoxy resin can be an epoxy resin at any degree of polymerization lower than the B-stage as heretofore defined. As a further alternative, the epoxy resin need not be advanced to the B-stage prior to photopolymerization of the PETA but such is not preferred because the second polymer would be liquid making the combined system difficult to process with ease.

It is preferred to use the epoxy resin in the B-stage prior to photopolymerization because, upon solvent drive off, this will provide a solid solution wherein both components are mutually dissolved. If the epoxy resin is in the B-stage, this solid solution will be in the form of a stable film which, though often somewhat tacky, will immobilize the constituents in a set position. If a liquid was present during exposure to actinic radiation, movement of the assembly could cause movement of the liquid and, if such movement was occurring during exposure, a great loss of definition would be encountered. Definition is also more difficult utilizing a liquid as compared to a solid solution even if no movement is encountered.

In any case, having formed the film of the PETA, the B-stage epoxy resin, photosensitizing agent and curing agent on a substrate, the assembly is now selectively exposed to actinic radiation through a mask for an effective length of time to polymerize the PETA. It will be obvious that the duration of exposure will depend on the film thickness, the light intensity, the distance of the assembly from the light, the concentration of both polymer systems, the concentration of sensitizer and the concentration of curing agent. The exact balancing of these various factors will be apparent to one skilled in the art in light of this specification. For instance, exposure of a 0.5 mil coating can be achieved by a 1 to 3 minute exposure to light emanating from a 500 watt mercury arc lamp at a distance of 15 inches. Increasing the distance to 30 inches, one would then expose for from 4 to 12 minutes. Obviously, a thicker film will require either a longer exposure or greater light intensity. These factors can easily be balanced by one skilled in the art to obtain an optimum exposure cycle for any given film.

After exposure, the assembly will comprise areas wherein the PETA is polymerized (those areas exposed to light) and areas wherein the PETA is still in monomeric form (those areas not exposed to light). The areas exposed to light will be less soluble due to the polymerization of the PETA than those areas not exposed to light. Accordingly, those areas unexposed (containing PETA monomer) can be removed by utilizing appropriate solvents which dissolve the unexposed portions of the photosensitive dielectric composition. For the system described, i.e., PETA and an epoxy resin, an appropriate solvent is methyl ethyl ketone. Generally speaking, operable solvents used in the present invention must selectively remove the unexposed areas, be noncorrosive toward the substrate material, and unreactive toward the curing agent remaining in the second polymer. Specific examples of solvents useful in the present invention are 1,1,1-trichloroethane and methyl ethyl ketone.

At this stage of the processing, there is obtained a negative of the mask utilized to expose the assembly. The polymerized areas comprise a PETA polymer, occluding therein the B-staged epoxy resin. As heretofore indicated, the occluding is due to the fact that a solid solution is formed, that is, the PETA and the epoxy resin are in intimate admixture, and when the polymeric matrix of the PETA is formed the B-staged epoxy resin is entangled therein.

It will be apparent from this processing step that the term "curing agent" used to define the materials for advancing the polymerization of the epoxy resin will not include actinic light, and further, that most preferably the epoxy resin is one which is free from groups or additives which will absorb light of a wavelength used to polymerize the MFVM.

The final integral processing step of the present invention is to cure the B-staged epoxy resin to the C-stage, thereby completing cross-linking of the resin and changing the epoxy resin to an insoluble, thermoset, infusible material.

However, before "curing" the second polymer it is preferred to first remove any residual solvent or volatile material which may be present in the film. If this is not done, blistering or cracking might result in the film. Any compatible art means can be used, e.g., by placing the assembly under a vacuum or oven baking in air below the curing temperature. In fact, the drying can even be done in the curing oven as a "pre-curing" step, that is, merely by running a first low temperature drying cycle with a subsequent temperature elevation to the curing temperature. Needless to say, if no significant volatiles are present, drying can be omitted.

Typically, oven drying is for about ½ to 1½ hours at 75° to 135° C in air, followed by oven curing in air at 150° to 180° C for about 1 to 2 hours. The oven atmosphere need not be air, but since air can be used, no need exists for more sophisticated systems.

The actual temperature of drying is not really critical so long as cracks or blisters do not result in the final product. One can even dry and cure simultaneously, but blisters or cracks usually will result.

The curing of epoxy resins is well known to the art, and, generally speaking, temperature and time relationships as used by the prior art to cure epoxy resins are used in the present invention. The PETA polymer does not appear to substantially change the temperatures and times of curings needed. The exact curing conditions will depend upon the degree of cross-linking or curing desired, as is well understood by the art.

At this stage, one has obtained a negative image of the mask used to expose the photosensitive dielectric composition comprising a cross-linked epoxy polymer (C-staged) which is apparently in the form of a complex entanglement with the PETA polymer.

The inventors wish to make it completely clear, however, that the exact physical structure which is obtained is not definitely known. It is believed to be a complex entanglement, however, it is feasible that a graft polymer of some type does occur during either photopolymerization or curing.

The resultant dielectric material has electrical properties that do not substantially vary from the properties predicted for an admixture of the two polymer systems utilized. If the ionically cured polymer is an epoxy system, the properties of the dielectric do not vary too greatly from that observed with similar epoxy systems per se.

In the heretofore general processing scheme described, the pressure of operation is of substantially no importance, with atmospheric pressure being utilized.

The temperature of solution formation is also of no importance so long as none of the constituents are decomposed. Typically, the solution is heated to a temperature sufficient to dissolve all components, e.g., 50° to 90° C.

The temperature of initial solvent drive off is that temperature which will evaporate the solvent without decomposing any of the materials used to form the initial film or liquid, and will typically be 50° to 80° C.

Generally speaking, solvent drive off should proceed slowly so as to not cause excessive splattering or blistering of the components. Complete solvent drive off is required, or else drying prior to curing will be needed.

The temperature of the irradiation is in accordance with art recognized procedures, typically room temperature, though no harm is encountered upon using higher or lower temperatures so long as, of course, decomposition is not initiated.

In light of the above discussion, the following specific example is offered to aid in an understanding of the present invention.

EXAMPLE 1

A solution was formed by mixing, at 20° C, 100 grams of pentaerythritol tetraacrylate, 195 grams of a B-staged epoxy resin in solvent and 6 grams of 2-tert-butylanthraquinone. The B-staged epoxy resin was of the bisphenol-A type having the formula

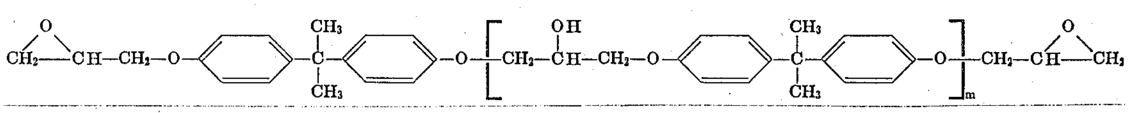

where m was such as to provide an epoxy equivalent weight of about 500 (a molecular weight of about 1,000). The B-staged epoxy resin in solvent which was used actually comprised the product of curing, by heating and stirring for 2 hours at 90° C 81.9 grams of epoxy resin, 4.4g dicyandiamide, 0.44g tetramethylbutanediamine, 73.2g ethyleneglycol monomethyl ether, and 35.1g methyl ethyl ketone. As reaction was in a closed container, all solvents remained and these were used for the resin system formation. After mixing the other components with the B-staged epoxy resin in the solvents, a homogeneous solution resulted which was coated on to a copper plate and thereafter heated to 75° C for 60 minutes to drive off the solvent and provide a film approximately 0.5 mils thick, having all remaining components in the composition ratio indicated.

The assembly was then exposed through a mask composed of a silver halide image on glass using a light source having an intensity of 500 watts spaced 18 inches from the assembly for a period of 1 minute at room temperature.

The assembly was then removed from the radiation area and washed for 1 minute in methyl ethyl ketone (PETA monomer area removal) at room temperature, whereafter a negative of the mask appeared on the substrate. The temperature of removal is of substantially no importance, merely being sufficient to remove the PETA unexposed areas, typically from 20° to 25° C.

Thereafter, the assembly was baked in air for 1 hour at 125° C and then 1 hour at 170° C to advance the B-staged epoxy resin to the C-stage, thereby drying and curing.

At this point, the essential processing steps of the present invention are completed.

Thereafter, additional circuitry could be applied to the assembly or the dielectric could be used as a final protective coating.

While the invention has been particularly shown and described with reference to preferred embodiments thereof, it will be understood by those skilled in the art that various changes in form and detail may be made therein without departing from the spirit and scope of the invention.

What is claimed is:

1. A composition of matter comprising:
a. a multi-functional vinyl monomer system comprising at least one photopolymerizable multi-functional vinyl monomer,
b. a latent photosensitizing agent which will initiate the photopolymerization of the multi-functional vinyl monomer system upon exposure to actinic radiation,
c. a cross-linkable polymer system comprising a cross-linkable polymer cured to an intermediate stage of cure, said cross-linkable polymer system not being substantially cured or further polymerized on exposure to actinic radiation,
d. a latent, thermally initiated curing agent for said cross-linkable polymer system, and
e. an inert solvent for all components.

2. The composition of claim 1 wherein the multifunctional vinyl monomer system and the cross-linkable polymer system are each present in an amount of 45 to 55 percent by weight.

3. The composition of claim 2 wherein the cross-linkable polymer system contains an epoxy selected from the group consisting of a bisphenol-A based epoxy resin, an epoxy-novolac resin and mixtures thereof, cured to the B-stage, said bisphenol-A based epoxy resin having the formula:

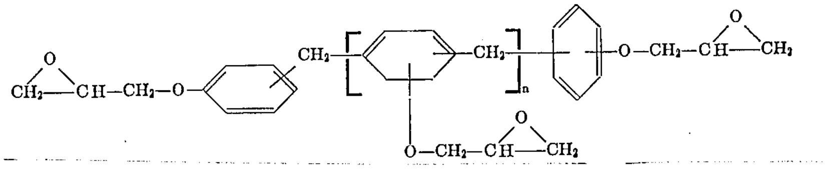

wherein m is sufficient to provide a molecular weight of from about 1,000 to about 4,000, and said epoxy-novolac resin having the formula:

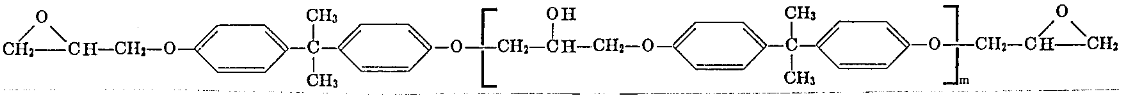

wherein n is from about 2/10 to about 2.

4. The composition of claim 3 wherein up to 95 percent by weight of the epoxy resin is replaced by a phenoxy resin, of the formula:

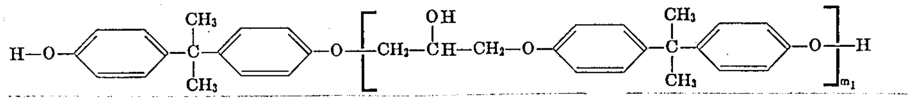

wherein $m_1$ provides a weight average molecular weight of from about 80,000 to about 200,000.

5. The composition of claim 4 wherein the multifunctional vinyl monomer system comprises at least 60 percent by weight of at least one multi-functional vinyl monomer which has the general formula:

$$RO-\left[CH_2-\underset{CH_2-OR}{\overset{CH_2-OR}{C}}-CH_2-O\right]_n-R$$

wherein n is 1 or 2 and R is $$-\overset{O}{\overset{\|}{C}}-CH=CH_2.$$

and no more than 40 percent (numerical basis) of monomers wherein one R group is other than $$-\overset{O}{\overset{\|}{C}}-CH=CH_2.$$

6. The composition of claim 5 wherein said one R group is selected from the group consisting of a methacrylate group, a fatty acid group with up to 18 carbon atoms and an aliphatic carboxylic acid group with up to 18 carbon atoms.

7. The composition of claim 1 wherein said photosensitizing agent is present in an amount of from 3 to 6 weight percent and is selected from the group consisting of a substituted quinone, an unsubstituted quinone, wherein the carbonyl group is attached directly to the conjugated central ring of said quinone, and ketaldonyl compounds.

8. The composition of claim 1 wherein said curing agent is selected from the group consisting of anhydride curing agents and dicyandiamide.

9. A process for selectively forming a dielectric layer comprising forming a composition comprising:

a. a multi-functional vinyl monomer system comprising at least one photopolymerizable multi-functional vinyl monomer, b. a latent photosensitizing agent which will initiate the photopolymerization of the multi-functional vinyl monomer system upon exposure to actinic radiation, c. a cross-linkable polymer system comprising a cross-linkable polymer cured to an intermediate stage of cure, said cross-linkable polymer system not being substantially cured or further polymerized on exposure to actinic radiation, d. a latent, thermally initiated curing agent for said cross-linkable polymer system, and e. an inert solvent for all components;

coating the composition onto a substrate, heating the composition to remove the solvent from the composition, selectively exposing the composition to actinic radiation, whereby the at least one multi-functional vinyl monomer is polymerized in the areas exposed to light but remains in monomeric form in areas unexposed to light;

removing the composition in areas unexposed to actinic radiation by dissolving the unexposed areas with solvent; and thermally advancing the cure of said cross-linkable polymer which is initially at an intermediate stage of cure while said cross-linkable polymer is occluded within said photopolymerized multi-functional vinyl monomer.

10. The process of claim 9 wherein said multi-functional vinyl monomer system and the cross-linkable polymer system are each present in an amount of 45 to 55 percent, by weight.

11. The process of claim 10 wherein the cross-linkable polymer system contains an epoxy resin selected from the group consisting of a bisphenol-A based epoxy resin, an epoxy-novolac resin and mixtures thereof, cured to the B-stage, said bisphenol-A based epoxy resin having the formula:

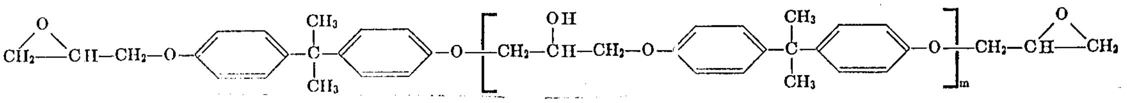

wherein m is sufficient to provide a molecular weight of from about 1,000 to about 4,000, and said epoxy-novolac resin having the formula:

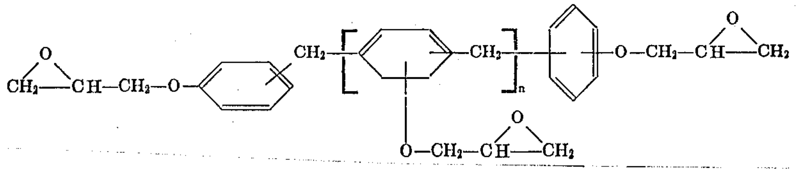

wherein n is from about 2/10 to about 2.

12. The process of claim 11 wherein up to 95 percent by weight of the epoxy resin is replaced by a phenoxy resin, of the formula:

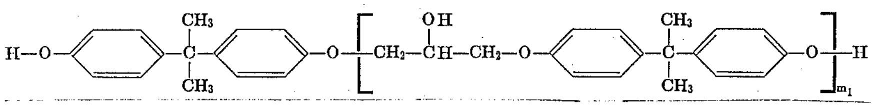

wherein $m_1$ provides a weight average molecular weight of from about 80,000 to about 200,000.

13. The process of claim 12 wherein the multi-functional vinyl monomer system comprises at least 60 percent by weight of at least one multi-functional vinyl monomer which has the general formula:

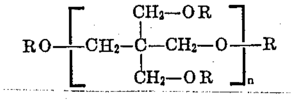

wherein n is 1 or 2 and R is

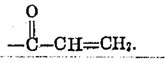

and no more than 40 percent (numerical basis) of monomers wherein one R group is other than

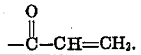

14. The process of claim 9 further comprising drying prior to thermally advancing the cure of the cross-linkable polymer to thereby remove volatiles.

15. A dielectric composition comprising the product of the process of claim 9.

* * * * *